(12) United States Patent
Kang

(10) Patent No.: US 11,855,628 B2
(45) Date of Patent: Dec. 26, 2023

(54) POWER DOMAIN CHANGE CIRCUIT AND OPERATING METHOD THEREOF

(71) Applicant: SK hynix Inc., Icheon-si (KR)

(72) Inventor: Ji Hyo Kang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/096,866

(22) Filed: Jan. 13, 2023

(65) Prior Publication Data

US 2023/0170905 A1 Jun. 1, 2023

Related U.S. Application Data

(63) Continuation of application No. 17/322,533, filed on May 17, 2021, now Pat. No. 11,588,485.

(30) Foreign Application Priority Data

Dec. 15, 2020 (KR) .................. 10-2020-0175191

(51) Int. Cl.
*H03K 19/017* (2006.01)
*H03K 19/0175* (2006.01)
*H03K 19/003* (2006.01)

(52) U.S. Cl.
CPC ... *H03K 19/017509* (2013.01); *H03K 19/003* (2013.01)

(58) Field of Classification Search
CPC ............... H03K 19/017509; H03K 19/003
USPC ................................................ 327/108
See application file for complete search history.

(56) References Cited

U.S. PATENT DOCUMENTS

2011/0148474 A1* 6/2011 Cook ............... G11C 7/1051
327/108
2013/0120029 A1* 5/2013 Li ................... H04L 25/0286
327/108

FOREIGN PATENT DOCUMENTS

KR 1020120051562 A 5/2012

* cited by examiner

*Primary Examiner* — Tomi Skibinski
(74) *Attorney, Agent, or Firm* — WILLIAM PARK & ASSOCIATES LTD.

(57) ABSTRACT

A power domain change circuit includes an input circuit and an output circuit. The input circuit is suitable for operating in a first power domain and generating first and second intermediate processing signals. The output circuit is suitable for operating in a second power domain and generating a final output signal by averaging and combining transition jitter components of the first and second intermediate processing signals.

17 Claims, 5 Drawing Sheets

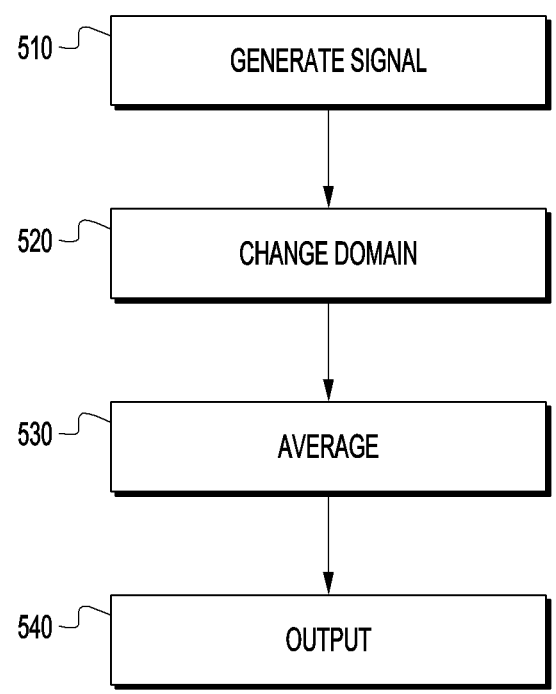

POWER DOMAIN CHANGE CIRCUIT AND OPERATING METHOD THEREOF

CROSS-REFERENCE TO RELATED APPLICATIONS

The present application is a continuation application of U.S. patent application Ser. No. 17/322,533, filed on May 17, 2021, and claims priority under 35 U.S.C. § 119(a) to Korean application number filed on Dec. 15, 2020, in the Korean Intellectual Property Office, which is incorporated herein by reference in its entirety.

BACKGROUND

1. Field

Embodiments relate to a power domain change circuit and an operating method thereof, and particularly, to a power domain change circuit capable of changing the domain of power for driving a signal in a signal processing process and an operating method thereof.

2. Discussion of the Related Art

In general, an integrated circuit, including a semiconductor device and a semiconductor memory device, receives a signal and performs various signal processing processes. In the signal processing process, the signal is driven based on predetermined power depending on the design. In this case, an input circuit that receives a signal and an output circuit that outputs a signal operate by different power.

FIG. 1 is a block diagram illustrating a configuration of a power domain change circuit 100 in accordance with prior art.

Referring to FIG. 1, the power domain change circuit 100 includes an input circuit 110 and an output circuit 120.

First, the input circuit 110 includes first and second inverting circuits INV1 and INV2. The first and second inverting circuits INV1 and INV2 each receive a first power supply VDD1 and a first ground power supply VSS1, and transfer an input signal SIG_IN. The first and second inverting circuits INV1 and INV2 have similar configurations. As a representative, the first inverting circuit INV1 includes a first PMOS transistor PM1 and a first NMOS transistor NM1 coupled in series between the first power supply VDD1 and the first ground power supply VSS1. Accordingly, the input signal SIG_IN input to the input circuit 110 is transferred while swinging between the first power supply VDD1 and the first ground power supply VSS2.

Next, the output circuit 120 includes third to fifth inverting circuits INV3, INV4, and INV5. The third to fifth inverting circuits INV3, INV4, and INV5 each receive a second power supply VDD2 and a second ground power supply VSS2, and transfer an output signal of the input circuit 110. The third to fifth inverting circuits INV3, INV4, and INV5 have similar configurations. As a representative, the third inverting circuit INV3 includes a second PMOS transistor PM2 and a second NMOS transistor NM2 coupled in series between the second power supply VDD2 and the second ground power supply VSS2. Accordingly, the output signal of the input circuit 110 input to the output circuit 120 is transferred while swinging between the second power supply VDD2 and the second ground power supply VSS2.

Through such a configuration of the power domain change circuit 100, the power domain of the input signal SIG_IN is changed from the first power supply VDD1 and the first ground power supply VSS1 to the second power supply VDD2 and the second ground power supply VSS2. A change in the power domain of the input signal SIG_IN essentially causes a transition jitter. In this case, the transition jitter means that in a process of the input signal SIG_IN being transferred, the amount of delay at a time at which a logic "high" level transitions to a logic "low" level is changed or the amount of delay at a time at which a logic "low" level transitions to a logic "high" level is changed.

As a result, a transition jitter occurring in the signal transfer process of the power domain change circuit 100 is incorporated into an output signal SIG_OUT of the power domain change circuit 100. Accordingly, all circuits using the output signal SIG_OUT in stages subsequent to the power domain change circuit 100 cannot secure stable circuit operation timing. Moreover, the output signal SIG_OUT into which the transition jitter is incorporated cannot correct reliability of a signal.

SUMMARY

In an embodiment, a power domain change circuit may include an input circuit suitable for operating in a first power domain and generating first and second intermediate processing signals by transferring an input signal. The power domain change circuit may also include an output circuit suitable for operating in a second power domain and generating a final output signal by averaging and combining transition jitter components occurring in a process of transferring the first and second intermediate processing signals.

In an embodiment, a method of driving a power domain change circuit may include a signal generation step of generating first and second intermediate processing signals by transferring an input signal in a first power domain, and a domain change step of changing power domains of the first and second intermediate processing signals from the first power domain to a second power domain and transferring the first and second intermediate processing signals. The method may also include an averaging step of averaging transition jitter components occurring in the domain change step, and an output step of generating a final output signal by combining output signals of the averaging step.

BRIEF DESCRIPTION OF THE DRAWINGS

FIG. 5 is a flowchart illustrating a driving method of the power domain change circuits of FIGS. 2 to 4.

DETAILED DESCRIPTION

The description of the present disclosure is merely an embodiment for a structural and/or functional description. The scope of rights of the present disclosure should not be construed as being limited to embodiments described in the specification. That is, the scope of rights of the present disclosure should be understood as including equivalents, which may realize the technical spirit, because an embodiment may be modified in various ways and may have various forms. Furthermore, objects or effects proposed in the present disclosure do not mean that a specific embodiment should include all objects or effects or include only such effects. Accordingly, the scope of rights of the present disclosure should not be understood as being limited thereby.

The meaning of terms used in this application should be understood as follows.

Terms, such as "first" and the "second," are used to distinguish one element from another element, and the scope of the present disclosure should not be limited by the terms. For example, a first element may be named a second element. Likewise, the second element may be named the first element. The terms "first" and "second" are not meant to suggest a specific number or order of elements.

An expression of the singular number should be understood as including plural expressions, unless clearly expressed otherwise in the context. Terms, such as "include" or "have," should be understood as indicating the existence of a set characteristic, number, step, operation, element, part, or a combination thereof, not excluding a possibility of the existence or addition of one or more other characteristics, numbers, steps, operations, elements, parts, or a combination thereof.

In steps, symbols (e.g., a, b, and c) are used for convenience of description, and the symbols do not describe an order of the steps. The steps may be performed in an order different from the order described in the context unless a specific order is clearly described in the context. That is, the steps may be performed according to a described order, may be performed substantially at the same time as the described order, or may be performed in reverse order of the described order.

All the terms used herein, including technological or scientific terms, have the same meanings as typically understood by those skilled in the art, unless otherwise defined. Terms defined in commonly used dictionaries should be construed as having the same meanings as those in the context in related technology and should not be construed as having ideal or excessively formal meanings, unless clearly defined in the application.

Various embodiments are directed to a power domain change circuit capable of stably performing a signal transfer process including a change in power domain, and an operating method thereof.

Figure 1:
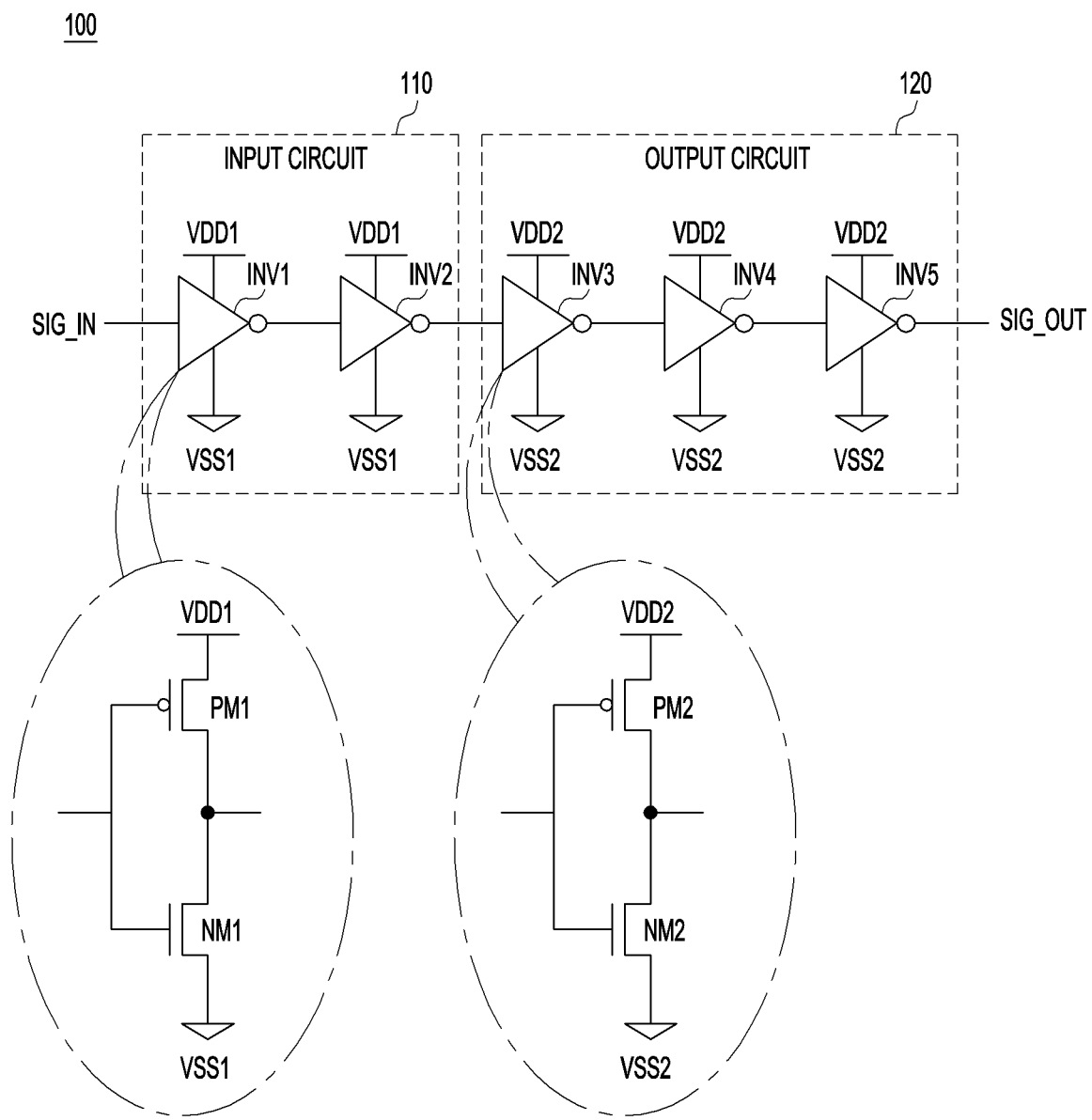
FIG. 1 is a block diagram illustrating a configuration of a power domain change circuit according to prior art.
Figure 2:
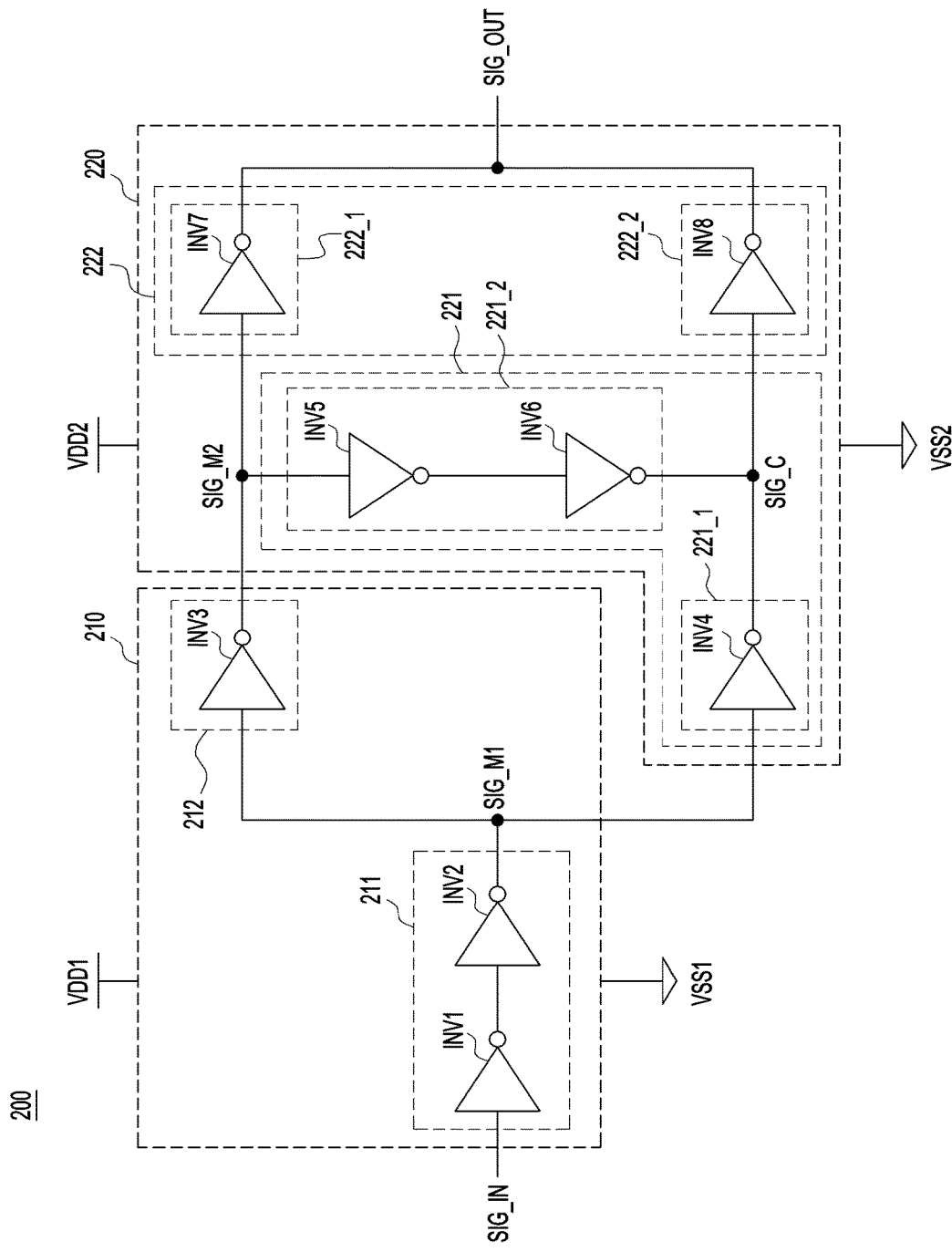
FIG. 2 is a block diagram illustrating a configuration of a power domain change circuit according to an embodiment of the present disclosure.

FIG. 2 is a block diagram illustrating a configuration of a power domain change circuit 200 according to an embodiment of the present disclosure.

Referring to FIG. 2, the power domain change circuit 200 may include an input circuit 210 and an output circuit 220.

First, the input circuit 210 may operate in a first power domain, and may be an element for generating first and second intermediate processing signals SIG_M1 and SIG_M2 by transferring an input signal SIG_IN. In this case, operating in the first power domain may mean that the input circuit 210 may operate by receiving a first power supply VDD1 and a first ground power supply VSS1. Furthermore, the first intermediate processing signal SIG_M1 and the second intermediate processing signal SIG_M2 may mutually have an inversion relation. The input circuit 210 is more specifically described. The input circuit 210 may include a transfer circuit 211 and an inversion circuit 212.

The transfer circuit 211 may be an element for receiving the input signal SIG_IN and outputting the input signal SIG_IN as the first intermediate processing signal SIG_M1. The transfer circuit 211 may include a first inverting circuit INV1 and a second inverting circuit INV2. The first inverting circuit INV1 may receive and invert the input signal SIG_IN and output the inverted signal. Furthermore, the second inverting circuit INV2 may receive and invert the output signal of the first inverting circuit INV1, and output the inverted output signal as the first intermediate processing signal SIG_M1. At this time, because the transfer circuit 211 operates in the first power domain, the input signal SIG_IN may be output as the first intermediate processing signal SIG_M1 while swinging between the first power supply VDD1 and the first ground power supply VSS1.

Next, the inversion circuit 212 may be an element for receiving and inverting the first intermediate processing signal SIG_M1 and outputting the inverted signal as the second intermediate processing signal SIG_M2. The inversion circuit 212 may include a third inverting circuit INV3. The third inverting circuit INV3 may receive and invert the first intermediate processing signal SIG_M1, and output the inverted signal as the second intermediate processing signal SIG_M2. At this time, because the inversion circuit 212 operates in the first power domain, the first intermediate processing signal SIG_M1 may be output as the second intermediate processing signal SIG_M2 while swinging between the first power supply VDD1 and the first ground power supply VSS1.

Through such a configuration, the input circuit 210 may receive the input signal SIG_IN, and may generate the first intermediate processing signal SIG_M1 corresponding to the input signal SIG_IN and generate the second intermediate processing signal SIG_M2 having an inversion relation with the input signal SIG_IN. Furthermore, the first and second intermediate processing signals SIG_M1 and SIG_M2 may be transferred while swinging between the first power supply VDD1 and the first ground power supply VSS1.

Next, the output circuit 220 may operate in a second power domain, and may be an element for generating a final output signal SIG_OUT by averaging and combining transition jitter components occurring in the process of transferring the first and second intermediate processing signals SIG_M1 and SIG_M2. In this case, operating in the second power domain may mean that the output circuit 220 may operate by receiving a second power supply VDD2 and a second ground power supply VSS2 different from the first power supply VDD1 and first ground power supply VSS1, respectively, of the first power domain.

Prior to a description of the output circuit 220, the first power domain and the second power domain may include different power supplies or may include different ground power supplies. More specifically, the first power supply VDD1 and the second power supply VDD2 may have different voltage levels. If the first power supply VDD1 and the second power supply VDD2 have the same voltage level, the first ground power supply VSS1 and the second ground power supply VSS2 may have different voltage levels. On the contrary, the first ground power supply VSS1 and the second ground power supply VSS2 may have different voltage levels. If the first ground power supply VSS1 and the second ground power supply VSS2 have the same voltage level, the first power supply VDD1 and the second power supply VDD2 may have different voltage levels.

For example, a voltage level of the first power supply VDD1 may be lower than a voltage level of the second power supply VDD2, and a voltage level of the first ground power supply VSS1 may be lower than a voltage level of the second ground power supply VSS2. In this case, a transition jitter may occur as the power domain of the input signal SIG_IN is changed from the first power supply VDD1 to the second ground power supply VSS2. Furthermore, a transition jitter may occur as the power domain of the input signal SIG_IN is changed from the first ground power supply VSS1 to the second power supply VDD2.

Next, the output circuit 220 is more specifically described. The output circuit 220 may include an averaging circuit 221 and a combination circuit 222.

The averaging circuit 221 may be an element for driving the first and second intermediate processing signals SIG_M1 and SIG_M2 in the second power domain and generating a correction signal SIG_C by averaging transition jitter components of the respective first and second intermediate processing signals SIG_M1 and SIG_M2. The averaging circuit 221 may include a first driving circuit 221_1 and a second driving circuit 221_2.

The first driving circuit 221_1 may be an element for receiving the first intermediate processing signal SIG_M1 and performing a first transition operation corresponding to the second power domain. The first driving circuit 221_1 may include a fourth inverting circuit INV4. The fourth inverting circuit INV4 may receive and invert the first intermediate processing signal SIG_M1, and output the inverted signal.

In this case, the first transition operation may mean that a level of a signal transitions from a logic "high" level to a logic "low" level or transitions from a logic "low" level to a logic "high" level. The first transition operation may have a concept opposite to that of a second transition operation to be described later. For example, if the first transition operation means that a level of a signal transitions from a logic "high" level to a logic "low" level, then the second transition operation may mean that a level of a signal transitions from a logic "low" level to a logic "high" level. On the contrary, if the first transition operation means that a level of a signal transitions from a logic "low" level to a logic "high" level, then the second transition operation may mean that a level of a signal transitions from a logic "high" level to a logic "low" level.

The second driving circuit 221_2 may be an element for receiving the second intermediate processing signal SIG_M2 and performing the second transition operation, that is, an operation opposite to the first transition operation. The second driving circuit 221_2 may include fifth and sixth inverting circuits INV5 and INV6. The fifth inverting circuit INV5 may receive and invert the second intermediate processing signal SIG_M2, and output the inverted signal. The sixth inverting circuit INV6 may receive and invert the output signal of the fifth inverting circuit INV5, and output the inverted signal.

Next, the output stage of the first driving circuit 221_1 and the output stage of the second driving circuit 221_2 may be coupled to a node in common. More specifically, the output stage of the fourth inverting circuit INV4 included in the first driving circuit 221_1 and the output stage of the sixth inverting circuit INV6 included in the second driving circuit 221_2 may be coupled to the common node. Furthermore, the correction signal SIG_C may be output through the common node.

Hereinafter, prior to a description of the combination circuit 222, a circuit operation of the averaging circuit 221 is described. A case where a level of the input signal SIG_IN is a logic "high" level is described as an example, for convenience of description.

As described above, the input circuit 210 may perform an operation by receiving the first power supply VDD1 and the first ground power supply VSS1. In other words, the first to third inverting circuits INV1, INV2, and INV3 may operate in the first power domain. Accordingly, the first and second intermediate processing signals SIG_M1 and SIG_M2, that is, the output signal of the second inverting circuit INV2 and the output signal of the third inverting circuit INV3, may be driven and transferred in the first power domain. That is, the input circuit 210 may generate the first and second intermediate processing signals SIG_M1 and SIG_M2 by transferring the input signal SIG_IN in the first power domain. At this time, a level of the first intermediate processing signal SIG_M1 may be a logic "high" level, and a level of the second intermediate processing signal SIG_M2 may be a logic "low" level.

Next, the output circuit 220 may perform an operation by receiving the second power supply VDD2 and the second ground power supply VSS2. In other words, the fourth to sixth inverting circuits INV4, INV5, and INV6 may operate in the second power domain. Accordingly, each of the output signals of the fourth to sixth inverting circuits INV4, INV5, and INV6 may be driven and output in the second power domain. In this case, the power domain of the first intermediate processing signal SIG_M1 may be changed through the fourth inverting circuit INV4, and the power domain of the second intermediate processing signal SIG_M2 may be changed through the fifth inverting circuit INV5. That is, the output circuit 220 may change the first and second intermediate processing signals SIG_M1 and SIG_M2 having the power domains into signal having the second power domain, and may transfer the first and second intermediate processing signals SIG_M1 and SIG_M2 in the second power domain.

In other words, while the first intermediate processing signal SIG_M1 passes through the fourth inverting circuit INV4, a transition jitter component from the logic "high" level to a logic "low" level may be incorporated into the first intermediate processing signal SIG_M1. Furthermore, while the second intermediate processing signal SIG_M2 passes through the fifth inverting circuit INV5, a transition jitter component from the logic "low" level to a logic "high" level may be incorporated into the second intermediate processing signal SIG_M2. An output signal of the fifth inverting circuit INV5 into which the transition jitter component has been incorporated may be output through the sixth inverting circuit INV6. Next, an output signal of the fourth inverting circuit INV4 and an output signal of the sixth inverting circuit INV6 may be output as the correction signal SIG_C through the common node. Accordingly, the correction signal SIG_C may be a signal obtained by averaging the transition jitter component from the logic "high" level to the logic "low" level incorporated into the first intermediate processing signal SIG_M1 and the transition jitter component from the logic "low" level to the logic "high" level incorporated into the second intermediate processing signal SIG_M2.

The combination circuit 222 of the output circuit 220 may be an element for generating the final output signal SIG_OUT by combining the second intermediate processing signal SIG_M2 and the correction signal SIG_C. The combination circuit 222 may include a third driving circuit 222_1 and a fourth driving circuit 222_2.

The third driving circuit 222_1 may be an element for receiving the second intermediate processing signal SIG_M2 and outputting the received signal as the final output signal SIG_OUT. The third driving circuit 222_1 may include a seventh inverting circuit INV7. The seventh inverting circuit INV7 may receive and invert the second intermediate processing signal SIG_M2, and may output the inverted signal as the final output signal SIG_OUT.

The fourth driving circuit 222_2 may be an element for receiving the correction signal SIG_C and outputting the received signal as the final output signal SIG_OUT. The fourth driving circuit 222_2 may include an eighth inverting circuit INV8. The eighth inverting circuit INV8 may receive and invert the correction signal SIG_C, and output the inverted signal as the final output signal SIG_OUT.

Next, the output stage of the third driving circuit 222_1 and the output stage of the fourth driving circuit 222_2 may be coupled to a node in common. That is, the output stage of the seventh inverting circuit INV7 included in the third driving circuit 222_1 and the output stage of the eighth inverting circuit INV8 included in the fourth driving circuit 222_2 may be coupled to the common node. Furthermore, the final output signal SIG_OUT may be output through the common node. Accordingly, the final output signal SIG_OUT may be a signal obtained by combining the output signal of the seventh inverting circuit INV7 and the output signal of the eighth inverting circuit INV8.

The power domain change circuit 200 according to an embodiment of the present disclosure may generate the final output signal SIG_OUT from which transition jitters occurring in a signal transfer process including a change in the power domain have been mitigated or removed by averaging and combining the transition jitters.

Figure 3:
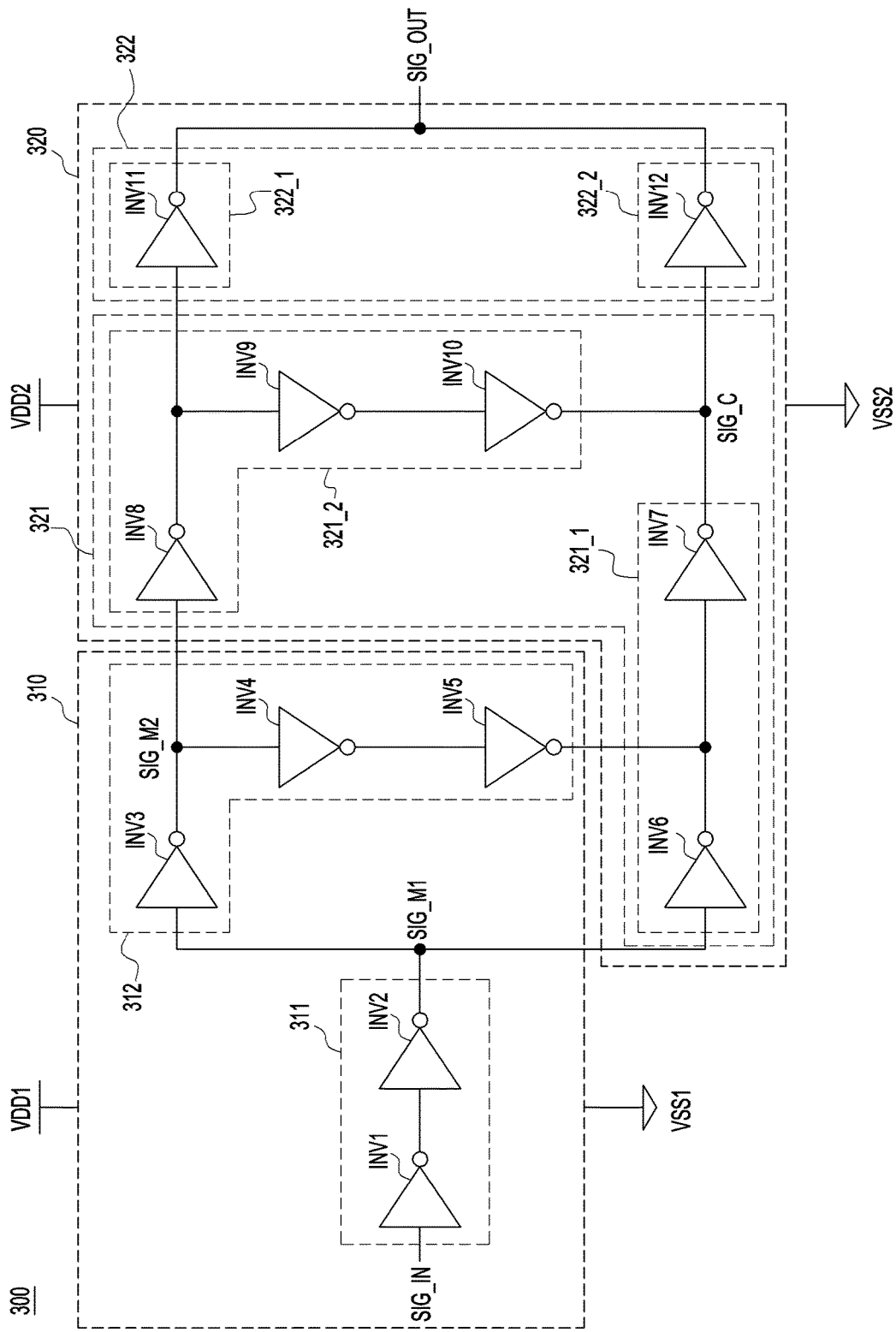
FIG. 3 is a block diagram illustrating a configuration of a power domain change circuit according to an embodiment of the present disclosure.

FIG. 3 is a block diagram illustrating a configuration of a power domain change circuit 300 according to an embodiment of the present disclosure.

Referring to FIG. 3, the power domain change circuit 300 may include an input circuit 310 and an output circuit 320.

First, the input circuit 310 may operate in a first power domain, and may be an element for generating first and second intermediate processing signals SIG_M1 and SIG_M2 by transferring an input signal SIG_IN. The input circuit 310 may include a transfer circuit 311 and an inversion circuit 312. The transfer circuit 311 may include first and second inverting circuits INV1 and INV2. The inversion circuit 312 may include third to fifth inverting circuits INV3, INV4, and INV5. The elements of the input circuit 310 may correspond to the elements of the input circuit 210 of FIG. 2, respectively. Accordingly, the input circuit 310 may receive the input signal SIG_IN, and may generate the first intermediate processing signal SIG_M1 corresponding to the input signal SIG_IN and the second intermediate processing signal SIG_M2 having an inversion relation with the input signal SIG_IN.

Next, the output circuit 320 may operate in a second power domain, and may be an element for generating a final output signal SIG_OUT by averaging and combining transition jitter components occurring in a process of transferring the first and second intermediate processing signals SIG_M1 and SIG_M2. The output circuit 320 may include an averaging circuit 321 and a combination circuit 322.

First, the averaging circuit 321 may include a first driving circuit 321_1 and a second driving circuit 321_2. In this case, the first driving circuit 321_1 may include sixth and seventh inverting circuits INV6 and INV7. The second driving circuit 321_2 may include eighth to tenth inverting circuits INV8, INV9, and INV10. The averaging circuit 321 may correspond to the averaging circuit 221 of FIG. 2. Accordingly, the averaging circuit 321 may drive the first and second intermediate processing signals SIG_M1 and SIG_M2 in the second power domain, and may generate a correction signal SIG_C by averaging transition jitter components of the respective first and second intermediate processing signals SIG_M1 and SIG_M2.

Next, the combination circuit 322 may include a third driving circuit 322_1 and a fourth driving circuit 322_2. In this case, the third driving circuit 322_1 may include an eleventh inverting circuit INV11. The fourth driving circuit 322_2 may include a twelfth inverting circuit INV12. The combination circuit 322 may correspond to the combination circuit 222 of FIG. 2. Accordingly, the combination circuit 322 may generate the final output signal SIG_OUT by combining the correction signal SIG_C and an output signal of the eighth inverting circuit INV8 corresponding to the second intermediate processing signal SIG_M2.

The power domain change circuit 300 according to an embodiment of the present disclosure may generate the final output signal SIG_OUT from which transition jitters occurring in a signal transfer process including a change in the power domain have been mitigated or removed by averaging and combining the transition jitters.

Figure 4:
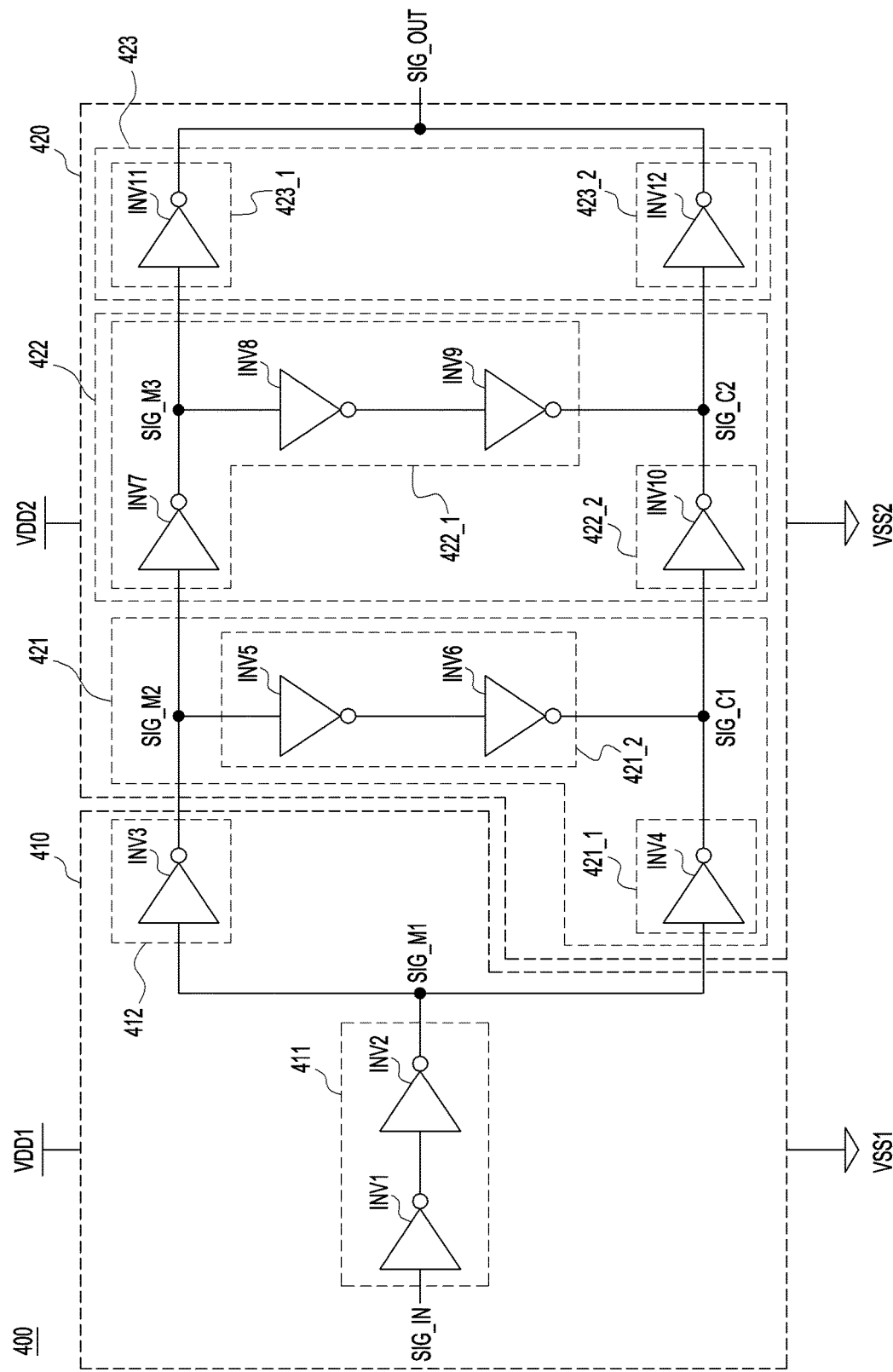
FIG. 4 is a block diagram illustrating a configuration of a power domain change circuit according to an embodiment of the present disclosure.

FIG. 4 is a block diagram illustrating a configuration of a power domain change circuit 400 according to an embodiment of the present disclosure.

Referring to FIG. 4, the power domain change circuit 400 may include an input circuit 410 and an output circuit 420.

First, the input circuit 410 may operate in a first power domain, and may be an element for generating first and second intermediate processing signals SIG_M1 and SIG_M2 by transferring an input signal SIG_IN. The input circuit 410 may include a transfer circuit 411 and an inversion circuit 412. The transfer circuit 411 may include first and second inverting circuits INV1 and INV2. The inversion circuit 412 may include a third inverting circuit INV3. The elements of the input circuit 410 may correspond to the elements of the input circuit 210 of FIG. 2, respectively. Accordingly, the input circuit 410 may receive the input signal SIG_IN, and may generate the first intermediate processing signal SIG_M1, corresponding to the input signal SIG_IN, and the second intermediate processing signal SIG_M2 having an inversion relation with the input signal SIG_IN.

Next, the output circuit 420 may operate in a second power domain, and may be an element for generating a final output signal SIG_OUT by averaging and combining transition jitter components occurring in a process of transferring the first and second intermediate processing signals SIG_M1 and SIG_M2. The output circuit 420 may include a first averaging circuit 421, a second averaging circuit 422, and a combination circuit 423. In this case, the first averaging circuit 421 may correspond to the averaging circuit 221 of FIG. 2, and the combination circuit 423 may correspond to the combination circuit 222 of FIG. 2. Furthermore, the output circuit 420 may further include the second averaging circuit 422 to be described later, compared to the configuration of FIG. 2.

First, the first averaging circuit 421 may be an element for driving the first and second intermediate processing signals SIG_M1 and SIG_M2 in the second power domain and generating a first correction signal SIG_C1 by averaging transition jitter components of the respective first and second intermediate processing signals SIG_M1 and SIG_M2.

The first averaging circuit 421 may include a first driving circuit 421_1 and a second driving circuit 421_2. In this case, the first driving circuit 421_1 may include a fourth inverting circuit INV4. The second driving circuit 421_2 may include fifth and sixth inverting circuits INV5 and INV6. The first averaging circuit 421 may correspond to the averaging circuit 221 of FIG. 2. Accordingly, the first averaging circuit 421 may drive the first and second intermediate processing signals SIG_M1 and SIG_M2 in the second power domain, and may generate the first correction signal SIG_C1 by averaging transition jitter components of the respective first and second intermediate processing signals SIG_M1 and SIG_M2.

Next, the second averaging circuit 422 may be an element for generating a second correction signal SIG_C2 by inverting and averaging the second intermediate processing signal SIG_M2 and the first correction signal SIG_C1. The second averaging circuit 422 may include a third driving circuit 422_1 and a fourth driving circuit 422_2.

The third driving circuit 422_1 may be an element for receiving the second intermediate processing signal SIG_M2 and performing a first transition operation. The third driving circuit 422_1 may include seventh to ninth inverting circuits INV7, INV8, and INV9. The seventh inverting circuit INV7 may receive and invert the second intermediate processing signal SIG_M2, and output the inverted signal. The eighth inverting circuit INV8 may receive and invert an output signal of the seventh inverting circuit INV7, and output the inverted signal. The ninth inverting circuit INV9 may receive and invert an output signal of the eighth inverting circuit INV8, and output the inverted signal.

The fourth driving circuit 422_2 may be an element for receiving the first correction signal SIG_C1 and performing a second transition operation. The fourth driving circuit 422_2 may include a tenth inverting circuit INV10. The tenth inverting circuit INV10 may receive and invert the first correction signal SIG_C1, and output the inverted signal.

Next, the output stage of the third driving circuit 422_1 and the output stage of the fourth driving circuit 422_2 may be coupled to a node in common. That is, the output stage of the ninth inverting circuit INV9 included in the third driving circuit 422_1 and the output stage of the tenth inverting circuit INV10 included in the fourth driving circuit 422_2 may be coupled to the common node. Furthermore, the second correction signal SIG_C2 may be output through the common node.

Next, the combination circuit 423 may be an element for generating the final output signal SIG_OUT by combing the second correction signal SIG_C2 and a third intermediate processing signal SIG_M3 inverted from the second intermediate processing signal SIG_M2.

The combination circuit 423 may include a fifth driving circuit 423_1 and a sixth driving circuit 423_2. In this case, the fifth driving circuit 423_1 may include an eleventh inverting circuit INV11, and the sixth driving circuit 423_2 may include a twelfth inverting circuit INV12. The combination circuit 423 may correspond to the combination circuit 222 of FIG. 2. Accordingly, the combination circuit 423 may generate the final output signal SIG_OUT by combining the third intermediate processing signal SIG_M3 and the second correction signal SIG_C2. The combination circuit 423 may correspond to the combination circuit 222 of FIG. 2. Accordingly, the combination circuit 423 may generate the final output signal SIG_OUT by combining the third intermediate processing signal SIG_M3 and the second correction signal SIG_C2.

FIG. 5 is a flowchart illustrating a driving method of the power domain change circuits 200, 300, and 400 of FIGS. 2, 3, and 4, respectively. Hereinafter, the driving method of the power domain change circuit 400 of FIG. 4 is basically described for convenience of description.

Referring to FIG. 5, the driving method of the power domain change circuit 400 may include a signal generation step 510, a domain change step 520, an averaging step 530, and an output step 540.

First, the signal generation step 510 may be a step for generating the first and second intermediate processing signals SIG_M1 and SIG_M2 by transferring the input signal SIG_IN in the first power domain. The signal generation step 510 may correspond to the circuit operation of the input circuit 410 of FIG. 4. Hereinafter, a case where a level of the input signal SIG_IN is a logic "high" level is described as an example, for convenience of description.

The input circuit 410 may perform an operation by receiving the first power supply VDD1 and the first ground power supply VSS1. That is, the input circuit 410 may generate the first and second intermediate processing signals SIG_M1 and SIG_M2 by transferring the input signal SIG_IN in the first power domain. In this case, a level of the first intermediate processing signal SIG_M1 may become a logic "high" level, and a level of the second intermediate processing signal SIG_M2 may become a logic "low" level.

Next, the domain change step 520 may be a step for changing the power domains of the first and second intermediate processing signals SIG_M1 and SIG_M2 into the second power domain and transferring the first and second intermediate processing signals SIG_M1 and SIG_M2 in the second power domain. The domain change step 520 may correspond to the circuit operation of the first averaging circuit 421 of FIG. 4.

The first averaging circuit 421 may perform an operation by receiving the second power supply VDD2 and the second ground power supply VSS2. That is, the fourth inverting circuit INV4 of the first averaging circuit 421 may change the first intermediate processing signal SIG_M1 having the first power domain into a signal having the second power domain. Furthermore, the fifth inverting circuit INV5 of the first averaging circuit 421 may change the second intermediate processing signal SIG_M2 having the first power domain into a signal having the second power domain. At this time, the fourth inverting circuit INV4 may perform a transition operation for changing a level of the first intermediate processing signal SIG_M1, input to the first averaging circuit 421, from a logic "high" level to a logic "low" level. Furthermore, the fifth inverting circuit INV5 may perform a transition operation for changing a level of the second intermediate processing signal SIG_M2 from a logic "low" level to a logic "high" level.

Next, the averaging step 530 may be a step for averaging transition jitter components occurring in the domain change step 520. The averaging step 530 may correspond to the circuit operations of the first averaging circuit 421 and second averaging circuit 422 of FIG. 4.

First, while the first intermediate processing signal SIG_M1 input to the first averaging circuit 421 passes through the fourth inverting circuit INV4, a transition jitter component from the logic "high" level to the logic "low" level may be incorporated into the first intermediate processing signal SIG_M1. Furthermore, while the second intermediate processing signal SIG_M2 passes through the fifth inverting circuit INV5, a transition jitter component from the logic "low" level to the logic "high" level may be incorporated into the second intermediate processing signal SIG_M2. An output signal of the fifth inverting circuit INV5 into which the transition jitter component has been incorporated may be output through the sixth inverting circuit INV6. Next, the output signal of the fourth inverting circuit INV4 and the output signal of the sixth inverting circuit INV6 may be output as the first correction signal SIG_C1 through the common node. Accordingly, the correction signal SIG_C1 may be a signal obtained by averaging the transition jitter component from the logic "high" level to the logic "low" level incorporated into the first intermediate processing signal SIG_M1 and the transition jitter component from the logic "low" level to the logic "high" level incorporated into the second intermediate processing signal SIG_M2. The averaging operation of the first averaging circuit 421 is defined as a "first averaging operation."

For reference, the first averaging operation may correspond to the circuit operation of the averaging circuit 221 of FIG. 2. In the case of FIG. 2, after the first averaging operation, the output step 540 may be performed.

Next, the second intermediate processing signal SIG_M2 input to the second averaging circuit 422 may be inverted by the seventh inverting circuit INV7, and the inverted signal may be output as the third intermediate processing signal SIG_M3. The third intermediate processing signal SIG_M3 may be output through the eighth and ninth inverting circuits INV8 and INV9. Furthermore, the first correction signal SIG_C1 may be inverted by the tenth inverting circuit INV10. The output signal of the ninth inverting circuit INV9 and the output signal of the tenth inverting circuit INV10 may be output as the second correction signal SIG_C2 through the common node. Accordingly, the second correction signal SIG_C2 may be a signal obtained by averaging inverted signals of the second intermediate processing signal SIG_M2 and the first correction signal SIG_C1. The averaging operation of the second averaging circuit 422 is defined as a "second averaging operation."

Next, the output step 540 may be a step for generating the final output signal SIG_OUT by combining output signals of the averaging step 530. The output step 540 may correspond to the circuit operation of the combination circuit 423 of FIG. 4.

The combination circuit 423 may generate the final output signal SIG_OUT by combining the third intermediate processing signal SIG_M3 and the second correction signal SIG_C2, that is, the output signals of the averaging step 530.

The power domain change circuit 400 according to an embodiment of the present disclosure may perform the first averaging operation on transition jitters occurring in a signal transfer process including a change in the power domain. Furthermore, the power domain change circuit 400 may mitigate or remove transition jitters from inverted signals through the second averaging operation after the first averaging operation. Furthermore, the power domain change circuit 400 may generate the final output signal SIG_OUT, from which transition jitters have been mitigated or removed, by combining signals after the first and second averaging operations.

An embodiment of the present disclosure has an effect in that it can mitigate or completely remove a jitter occurring in an output signal by stably changing the power domain of a transferred signal.

Although various embodiments have been described for illustrative purposes, it will be apparent to those skilled in the art that various changes and modifications may be made without departing from the spirit and scope of the disclosure as defined in the following claims.

What is claimed is:
1. A power domain change circuit comprising:
a transfer circuit operating in a first power domain, and configured to receive an input signal to output a first intermediate signal;
an inversion circuit operating in the first power domain, and configured to invert the first intermediate signal to output a second intermediate signal;
an averaging circuit operating in a second power domain, and configured to invert the first intermediate signal and non-invert the second intermediate signal to generate a correction signal; and
a combination circuit operating in the second power domain, and configured to combine the second intermediate signal and the correction signal to generate an output signal.

2. The power domain change circuit of claim 1, wherein:
the first power domain comprises a first power supply and a first ground power supply,
the second power domain comprises a second power supply and a second ground power supply, and
the first power domain and the second power domain comprise at least one of different power supplies and different ground power supplies.

3. The power domain change circuit of claim 2, wherein:
a voltage level of the first power supply is lower than a voltage level of the second power supply, and
a voltage level of the first ground power supply is lower than a voltage level of the second ground power supply.

4. The power domain change circuit of claim 1, wherein the averaging circuit is configured to generate the correction signal by averaging the transition jitter components of the first and second intermediate processing signals.

5. The power domain change circuit of claim 1, wherein the averaging circuit comprises:
a first driving circuit configured to invert the first intermediate signal and output the inverted first intermediate signal as the correction signal; and
a second driving circuit configured to non-invert the second intermediate signal and output the non-inverted second intermediate signal as the correction signal.

6. The power domain change circuit of claim 1, wherein the combination circuit comprises:
a third driving circuit configured to drive the second intermediate signal and output the driven second intermediate signal as the output signal; and
a fourth driving circuit configured to drive the correction signal and output the driven correction signal as the output signal.

7. A power domain change circuit comprising:
a transfer circuit operating in a first power domain, and configured to receive an input signal to output a first intermediate signal;
an inversion circuit operating in the first power domain, and configured to invert the first intermediate signal to output a second intermediate signal;
a first averaging circuit operating in a second power domain, and configured to drive the first and second intermediate signal to generate a first correction signal;
a second averaging circuit operating in the second power domain, configured to invert the second intermediate signal to generate a third intermediate signal, and configured to drive the third intermediate signal and the first correction signal to generate a second correction signal; and
a combination circuit operating in the second power domain, and configured to combine the third intermediate signal and the second correction signal to generate an output signal.

8. The power domain change circuit of claim 7, wherein:
the first power domain comprises a first power supply and a first ground power supply, the second power domain comprises a second power supply and a second ground power supply, and the first power domain and the second power domain comprise at least one of different power supplies and different ground power supplies.

9. The power domain change circuit of claim 8, wherein:

a voltage level of the first power supply is lower than a voltage level of the second power supply, and a voltage level of the first ground power supply is lower than a voltage level of the second ground power supply.

10. The power domain change circuit of claim 7, wherein the averaging circuit is configured to generate the first correction signal by averaging the transition jitter components of the first and second intermediate processing signals.

11. The power domain change circuit of claim 7, wherein the first averaging circuit comprises:

a first driving circuit configured to invert the first intermediate signal and output the inverted first intermediate signal as the first correction signal; and a second driving circuit configured to non-invert the second intermediate signal and output the non-inverted second intermediate signal as the first correction signal.

12. The power domain change circuit of claim 7, wherein the second averaging circuit comprises:

a third driving circuit configured to invert the second intermediate signal to generate the third intermediate signal, and to non-invert the third intermediate signal to output the non-inverted third intermediate signal to the second correction signal; and a fourth driving circuit configured to invert the first correction signal to output the inverted first correction signal to the second correction signal.

13. The power domain change circuit of claim 7, wherein the combination circuit comprises:

a fifth driving circuit configured to drive the third intermediate signal and output the driven third intermediate signal as the output signal; and a sixth driving circuit configured to drive the second correction signal and output the driven second correction signal as the output signal.

14. A power domain change circuit comprising:

a transfer circuit operating in a first power domain, and configured to receive an input signal to output a first intermediate signal;

an inversion circuit operating in the first power domain, and configured to invert the first intermediate signal to generate a second intermediate signal, and to non-invert the second intermediate signal;

a first driving circuit operating in a second power domain and including first and second inverters, wherein the first inverter inverts the first intermediate signal, the second inverter inverts the output from the first inverter to generate a correction signal, and the non-inverted second intermediate signal is combined with the output from the first inverter;

a second driving circuit operating in the second power domain, configured to invert the second intermediate signal to generate an inverted second intermediate signal, and configured to drive the inverted second intermediate signal to generate a correction signal; and a combination circuit operating in the second power domain, and configured to combine the inverted second intermediate signal and the correction signal to generate an output signal.

15. The power domain change circuit of claim 14, wherein:

the first power domain comprises a first power supply and a first ground power supply, the second power domain comprises a second power supply and a second ground power supply, and the first power domain and the second power domain comprise at least one of different power supplies and different ground power supplies.

16. The power domain change circuit of claim 15, wherein:

a voltage level of the first power supply is lower than a voltage level of the second power supply, and a voltage level of the first ground power supply is lower than a voltage level of the second ground power supply.

17. The power domain change circuit of claim 14, wherein the combination circuit comprises:

a third driving circuit configured to drive the inverted second intermediate signal and output the driven inverted second intermediate signal as the output signal; and a fourth driving circuit configured to drive the correction signal and output the driven correction signal as the output signal.

* * * * *